US007915838B2

(12) United States Patent
VanEss

(10) Patent No.: US 7,915,838 B2
(45) Date of Patent: Mar. 29, 2011

(54) DELTA-SIGMA SIGNAL DENSITY MODULATION FOR OPTICAL TRANSDUCER CONTROL

(75) Inventor: David VanEss, Arlington, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 819 days.

(21) Appl. No.: 11/823,904

(22) Filed: Jun. 29, 2007

(65) Prior Publication Data

US 2009/0001905 A1 Jan. 1, 2009

(51) Int. Cl.
*H05B 37/02* (2006.01)
*H03M 3/00* (2006.01)

(52) U.S. Cl. ........................................ 315/302; 341/143

(58) Field of Classification Search .................. 315/291, 315/302, 307; 341/56, 77, 143
See application file for complete search history.

(56) References Cited

U.S. PATENT DOCUMENTS

| | | | | |
|---|---|---|---|---|
| 4,439,756 | A * | 3/1984 | Shenoi et al. | 341/143 |
| 5,287,107 | A * | 2/1994 | Gampell et al. | 341/137 |
| 6,016,038 | A | 1/2000 | Mueller et al. | |
| 6,150,774 | A | 11/2000 | Mueller et al. | |
| 6,597,371 | B2 | 7/2003 | Mandl | |
| 7,122,974 | B2 | 10/2006 | Shimizu et al. | |
| 7,304,594 | B2 * | 12/2007 | Sakura et al. | 341/143 |
| 7,369,067 | B2 * | 5/2008 | Kishi et al. | 341/53 |
| 2004/0263225 | A1 | 12/2004 | Perrott et al. | |
| 2006/0227070 | A1 | 10/2006 | Danstrom | |
| 2007/0115248 | A1 | 5/2007 | Roberts et al. | |

OTHER PUBLICATIONS

The Written Opinion of the International Searching Authority for International Application No. PCT/US08/08056 mailed Jun. 18, 2009; 5 pages.
International Search Report for International Application No. PCT/US08/08056 mailed Jun. 18, 2009; 2 pages.

* cited by examiner

*Primary Examiner* — Jacob Y Choi
*Assistant Examiner* — Jimmy T Vu

(57) ABSTRACT

A controller for optical transducers uses delta-sigma signal density modulation to reduce electromagnetic interference.

14 Claims, 10 Drawing Sheets

--RELATED ART--

--RELATED ART--

--RELATED ART--

--RELATED ART--

200

| A | B | A+B | Σ | Δ |
|---|---|---|---|---|
| 0 | 7 | 7 | 7 | 0 |
| 7 | 7 | 14 | 14 | 0 |
| 14 | 7 | 21 | 5 | 1 |
| 5 | 7 | 12 | 12 | 0 |
| 12 | 7 | 19 | 3 | 1 |
| 3 | 7 | 10 | 10 | 0 |
| 10 | 7 | 17 | 1 | 1 |
| 1 | 7 | 8 | 8 | 0 |
| 8 | 7 | 15 | 15 | 0 |
| 15 | 7 | 22 | 6 | 1 |
| 6 | 7 | 13 | 13 | 0 |
| 13 | 7 | 20 | 4 | 1 |
| 4 | 7 | 11 | 11 | 0 |
| 11 | 7 | 18 | 2 | 1 |
| 2 | 7 | 9 | 9 | 0 |
| 9 | 7 | 16 | 0 | |

Figure 4A

400

| SD | m | CLOCK CYCLE 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0.0625 | 1 | 0 | 0 | 0 | 0 | 0 | 0 | 0 | 0 | 0 | 0 | 0 | 0 | 0 | 0 | 0 | 1 |
| 0.1250 | 2 | 0 | 0 | 0 | 0 | 0 | 0 | 0 | 1 | 0 | 0 | 0 | 0 | 0 | 0 | 0 | 1 |
| 0.1875 | 3 | 0 | 0 | 0 | 0 | 0 | 1 | 0 | 0 | 0 | 0 | 1 | 0 | 0 | 0 | 0 | 1 |
| 0.2500 | 4 | 0 | 0 | 0 | 1 | 0 | 0 | 0 | 1 | 0 | 0 | 0 | 1 | 0 | 0 | 0 | 1 |
| 0.3125 | 5 | 0 | 0 | 0 | 1 | 0 | 0 | 1 | 0 | 0 | 1 | 0 | 0 | 1 | 0 | 0 | 1 |
| 0.3750 | 6 | 0 | 0 | 1 | 0 | 0 | 1 | 0 | 1 | 0 | 0 | 1 | 0 | 0 | 1 | 0 | 1 |
| 0.4375 | 7 | 0 | 0 | 1 | 0 | 1 | 0 | 1 | 0 | 0 | 1 | 0 | 1 | 0 | 1 | 0 | 1 |
| 0.5000 | 8 | 0 | 1 | 0 | 1 | 0 | 1 | 0 | 1 | 0 | 1 | 0 | 1 | 0 | 1 | 0 | 1 |
| 0.5625 | 9 | 0 | 1 | 0 | 1 | 0 | 1 | 0 | 1 | 1 | 0 | 1 | 0 | 1 | 0 | 1 | 1 |
| 0.6250 | 10 | 0 | 1 | 0 | 1 | 1 | 0 | 1 | 1 | 0 | 1 | 0 | 1 | 1 | 0 | 1 | 1 |
| 0.6875 | 11 | 0 | 1 | 1 | 0 | 1 | 1 | 0 | 1 | 1 | 0 | 1 | 1 | 0 | 1 | 1 | 1 |
| 0.7500 | 12 | 0 | 1 | 1 | 1 | 0 | 1 | 1 | 1 | 0 | 1 | 1 | 1 | 0 | 1 | 1 | 1 |
| 0.8125 | 13 | 0 | 1 | 1 | 1 | 1 | 0 | 1 | 1 | 1 | 1 | 0 | 1 | 1 | 1 | 1 | 1 |
| 0.8750 | 14 | 0 | 1 | 1 | 1 | 1 | 1 | 1 | 1 | 0 | 1 | 1 | 1 | 1 | 1 | 1 | 1 |
| 0.9375 | 15 | 0 | 1 | 1 | 1 | 1 | 1 | 1 | 1 | 1 | 1 | 1 | 1 | 1 | 1 | 1 | 1 |

Figure 4C

DELTA-SIGMA SIGNAL DENSITY MODULATION FOR OPTICAL TRANSDUCER CONTROL

TECHNICAL FIELD

Embodiments of the present invention relate to the field of optical transducer control and, in particular, to the use of delta-sigma signal density modulation for intensity control of light-emitting diodes.

BACKGROUND

Light-emitting diode (LED) technology has advanced to the point where LEDs can be used as energy efficient replacements for conventional incandescent and/or fluorescent light sources. One application where LEDs have been employed is in ambient lighting systems using white and/or color (e.g., red, green and blue) LEDs. Like incandescent and fluorescent light sources, the average intensity of an LED's output is controlled by the average current through the device. Unlike incandescent and fluorescent light sources, however, LEDs can be switched on and off almost instantaneously. As a result, their intensity can be controlled by switching circuits that switch the device current between two current states to achieve a desired average current corresponding to a desired intensity. This approach can also be used to control the relative intensities of red, green and blue (RGB) LED sources (or any other set of primary colors) in ambient lighting systems that mix primary colors in different ratios to achieve a desired color.

One approach to LED switching is described in U.S. Pat. Nos. 6,016,038 and 6,150,774 of Meuller et al. These patents describe the control of different LEDs with square waves of uniform frequency but independent duty cycles, where the square wave frequency is uniform and the different duty cycles represent variations in the width of the square wave pulses. The Meuller patents describe this as pulse width modulation (PWM).

FIG. 1 illustrates a conventional PWM controller driving a current source that supplies current to an LED. The PWM controller includes an n-bit linear counter, an n-bit duty cycle register and a comparator that compares the outputs of the counter and the duty cycle register. The n-bit counter is clocked by a clock signal $f_{clock}$ that causes the counter to count linearly from 0 to $2^n-1$, rolling over to 0 after reaching $2^n-1$. The value in the duty cycle register determines the duty cycle of the PWM controller, with the value "0" representing a 0 percent duty cycle and the value "$2^n-1$" representing a 100 percent duty cycle. When the output of the counter is less than the value in the duty cycle register, the output of the comparator is high. When the output of the counter is greater than or equal to the value in the duty cycle register, the output of the comparator is low.

FIG. 2A illustrates the relationship between the output of the n-bit counter and the value in the duty cycle register for the case of n=4 and a value of 7 (binary 0111) in the duty cycle register. Over one period, the linear counter counts from 0 to 15 (binary 1111). While the counter counts from 0 to 6, the comparator output is high (shown as a value of '1' in FIG. 2B). When the count of the linear counter reaches the register value (7), the PWM output goes low (shown as a value of '0' as in FIG. 2B) and stays low until the linear counter rolls over to zero at the end of the period. As a result, the PWM controller produces a timing waveform with a single transition from high to low, and therefore a single pulse during each period.

As illustrated in FIG. 2C, for n=8 and $f_{clock}$=1 MHz, the spectral content of this output includes a fixed fundamental frequency of $f_{OUT}=f_{clock}/2^n$=4 KHz and odd harmonics at $3f_{OUT}$=12 KHz, $5f_{OUT}$=20 KHz, etc., which can cause electromagnetic interference (EMI) to sensitive devices, components, circuits and systems nearby. When multiple light sources are used for color mixing, with their intensities controlled with pulse width modulation, the EMI will be multiplied because all of the light sources will be modulated at the same uniform frequency, independent of duty cycle.

BRIEF DESCRIPTION OF THE DRAWINGS

The present invention is illustrated by way of example, and not by way of limitation, in the figures of the accompanying drawings, in which:

FIG. 4A is a table illustrating data values for an exemplary embodiment of DSSD modulator;

FIG. 4C is a table illustrating a range of delta-sigma modulation (DSM) values in one embodiment;

DETAILED DESCRIPTION

Described herein are methods and apparatus for controlling optical transducers using delta-sigma signal density (DSSD) modulation (also referred to herein as delta-sigma modulation, or DSM). The following description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

In one embodiment, a method for controlling an optical transducer includes providing a controllable current to a light-emitting diode and controlling the current with a delta-sigma signal density modulation waveform to select a light intensity output from the light-emitting diode. In one embodiment, an apparatus for controlling an optical transducer includes a controllable current source coupled to a light-emitting diode and a controller coupled to the controllable current source, where the controller is configured to provide a delta-sigma signal density control signal to the controllable current source and where the delta-sigma signal density control signal has a selected signal density to control the luminous flux of the light-emitting diode.

Figure 3:
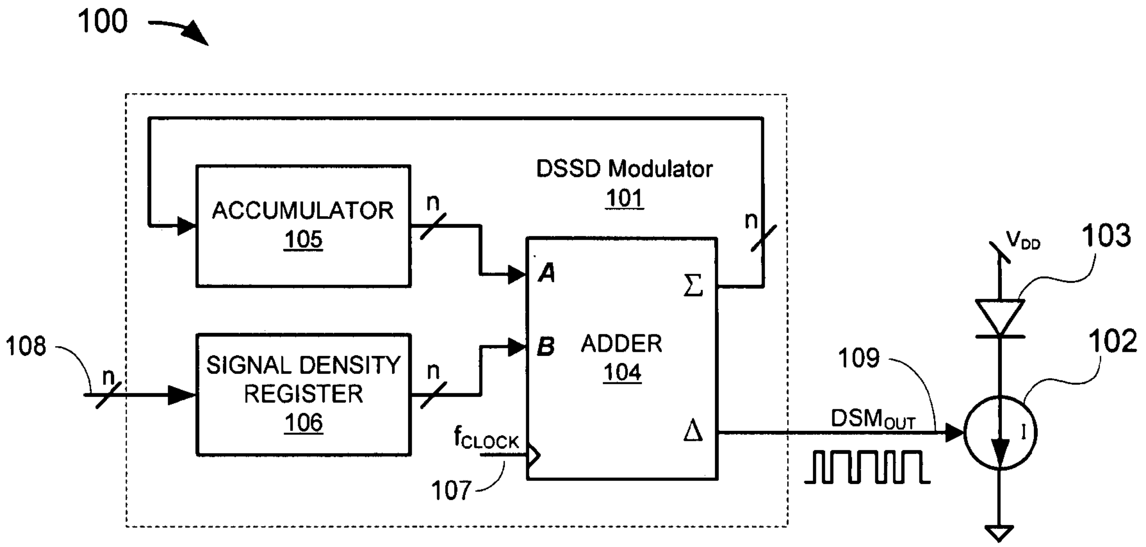
FIG. 3 illustrates one embodiment of a delta-sigma signal density (DSSD) modulator for dimming control of an optical transducer.

FIG. 3 is a block diagram 100 illustrating delta-sigma signal density modulation of an LED in one embodiment. FIG. 3 includes a delta-sigma signal density (DSSD) modulator 101 that is coupled to a controllable current supply 102 that drives an LED 103. The DSSD modulator 101 includes an n-bit accumulator 105, coupled to a first input (input A) of an n-bit adder 104. DSSD modulator 101 also includes an n-bit signal density register 106, coupled to a second input (input B) of the n-bit adder 104. The n-bit adder 104 also has a sigma (Σ) output and a delta (Δ) output.

The signal density register 106, which may be any type of register or latch as is known in the art, is programmed with an n-bit binary value on input line 108 having a value between 0 and $2^n-1$, which corresponds to a signal density between 0 and $(2^n-1)/2^n$ as described below. Adder 104 is clocked by a clock signal $f_{clock}$ on line 107. Each time adder 104 is clocked, the n-bit value at input A from accumulator 105 is added to the n-bit value at input B from signal density register 106. If the sum of the n-bit values at inputs A and B is less than $2^n$, the delta output of adder 104 is low (i.e., logical "0") and the sum is expressed at the sigma output of adder 104 and stored in accumulator 105. If the sum of the n-bit values at inputs A and B is equal to or greater than $2^n$, the adder overflows and the delta output of adder 104 is high (i.e., logical "1"). The remainder is expressed at the sigma output of adder 104 and stored in accumulator 105. The value stored in accumulator 105 is used as the next value of input A of adder 104 on the succeeding clock cycle. Mathematically, the operation of the adder 104 may be expressed as $\Sigma=\text{modulo}[(A+B)/2^n]$ and $\Delta=\text{integer}[(A+B)/2^n]$.

Figure 4B:
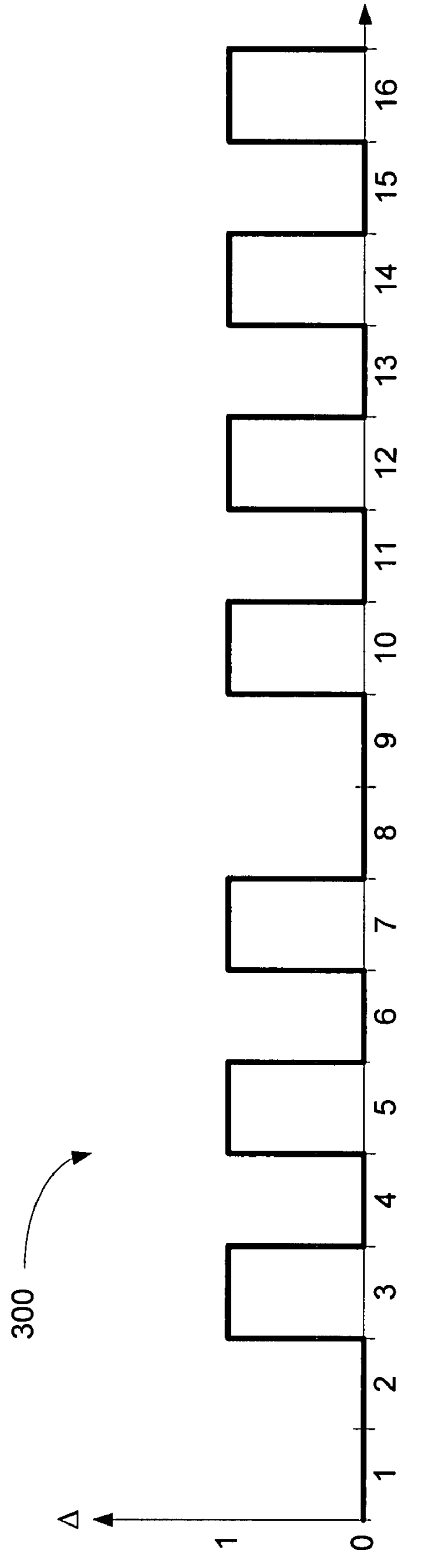
FIG. 4B illustrates a waveform in one embodiment corresponding to the data values of FIG. 4A.

FIG. 4A is a table 200 illustrating the operation of an exemplary configuration of a delta-sigma signal density modulator with n=4, a signal density register value of 7 (binary 0111) and an initial accumulator value of zero. As illustrated in FIG. 4, the output of adder 104 is periodic over 16 cycles with the following sequence:

7 14 5Δ 12 3Δ 10 1Δ 8 15 6Δ 13 4Δ 11 2Δ 9 0Δ where the numerical value is the decimal value of the sigma output and "Δ" indicates that the delta output of adder 104 is "1." FIG. 4B is a waveform 300 representing the value of the delta output of adder 104 over the 16 clock cycles of the example illustrated in FIG. 4A. The waveform 300 is a sequence of pulses having a high value for 7 of the 16 clock cycles to provide a signal density of 7/16=0.4375. In general, for any number of bits n and given a signal density register value of $0<m<2^n-1$, the signal density (SD) of the output of the DSSD modulator 101 will be given by $SD=m/2^n$.

Figure 4D:
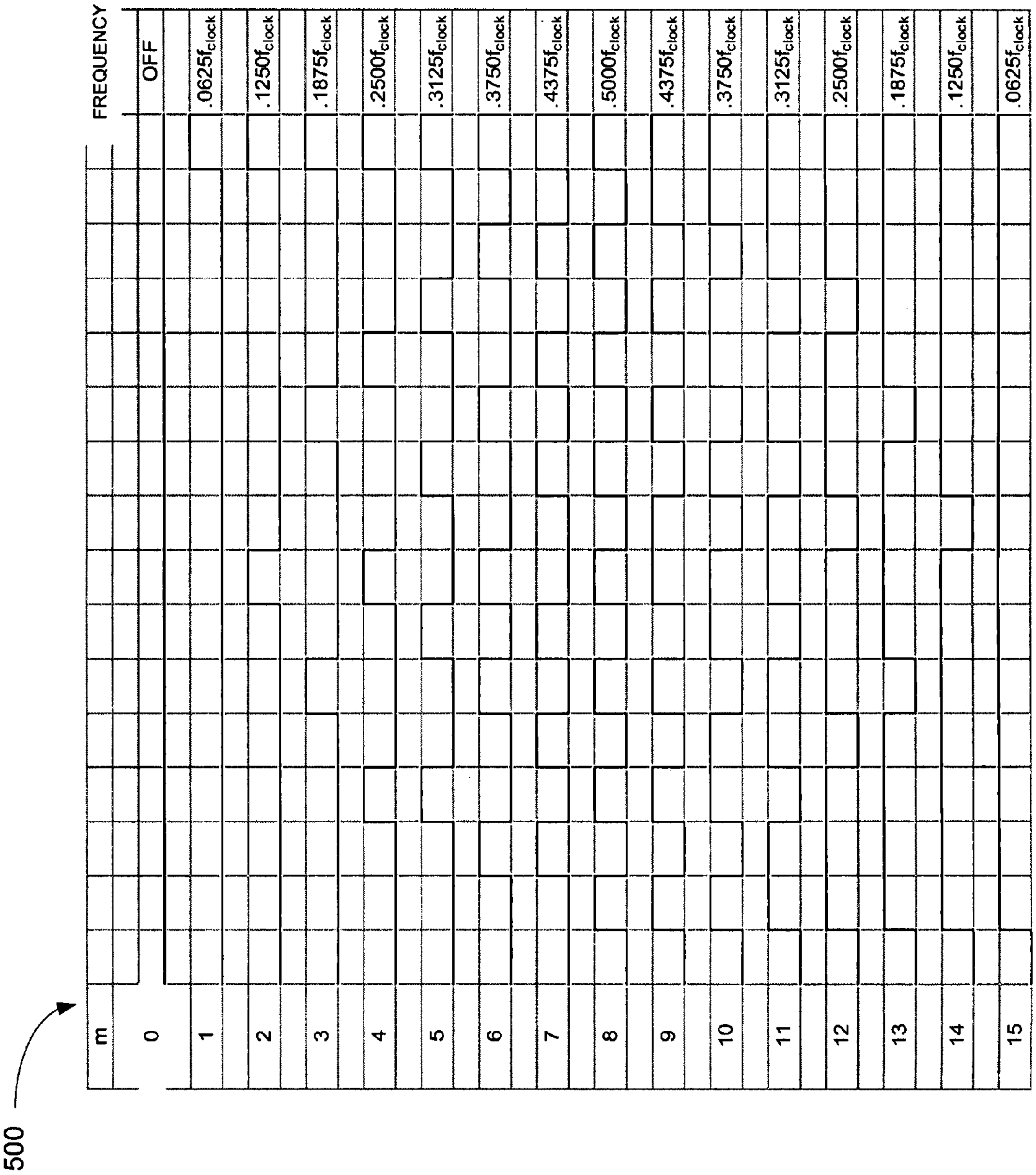
FIG. 4D illustrates waveforms in one embodiment corresponding to selected data values of FIG. 4C.

FIG. 4C is a table 400 listing the sequence of delta outputs for all values of m between 0 and 15 for the exemplary 4-bit DSSD modulator described above. FIG. 4D is a sequence of delta-sigma modulated (DSM) waveforms 500 illustrating the DSSD modulator outputs corresponding to each of the values of m between 0 and 15 for the exemplary 4-bit DSSD modulator. It can be seen that the frequency of the DSM waveforms change as the signal density changes. For the degenerate case of m=0, the frequency is zero. At other values of m, the frequency is:

$$f_{OUT}=\min[SD,(1-SD)]\times f_{clock}$$

where min[a,b] is an operator that selects the lowest value from arguments a and b. For an n-bit DSDS modulator, the minimum non-zero signal density is $1/2^n$, so that the minimum non-zero output frequency is $f_{OUT_{min}}=f_{clock}/2^n$. This result may be compared with the conventional PWM modulator, which as noted above has a fixed frequency of $f_{OUT}=f_{clock}/2^n$. Therefore, for a given value of n and $f_{clock}$, the DSSD modulator will have a frequency output that is greater than or equal to the frequency of a conventional PWM modulator. The DSSD modulator will also operate at $2^{n-1}$ different frequencies over the range possible signal densities from 1 to $2^n-1$, because each pair of signal densities [SD, (1−SD)] will generate a DSM signal at a different frequency.

The delta output of adder 104 may be coupled to a controllable constant current source 102 to gate the current through an LED 103. In one embodiment, the constant current source 102 may be on (e.g., supplying a constant current I) when the delta value is high and off when the delta value is low. As a result, the average current through the LED 103 will be equal to the signal density times I. The intensity (illumination flux) of the LED is proportional to the average current. Therefore, the intensity of the LED can be controlled by changing the value in the signal density register 106 (it will be appreciated that in other embodiments, current supply 102 may switch between two non-zero current states).

Figure 5A:
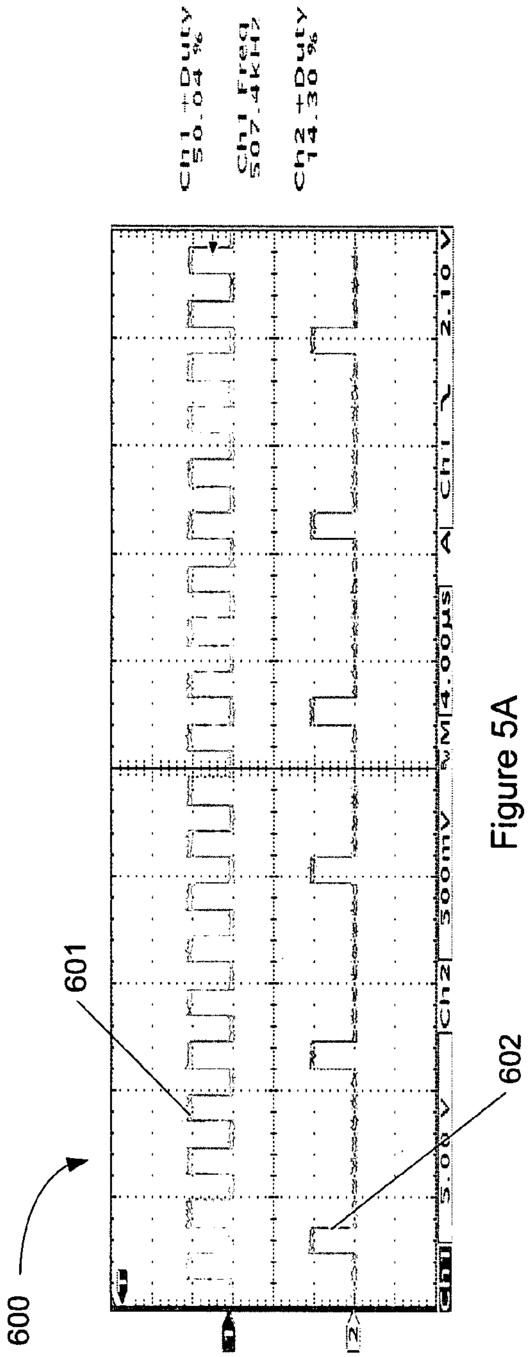
FIG. 5A illustrates two waveforms corresponding to two different delta-sigma signal densities in one embodiment.
Figure 5B:
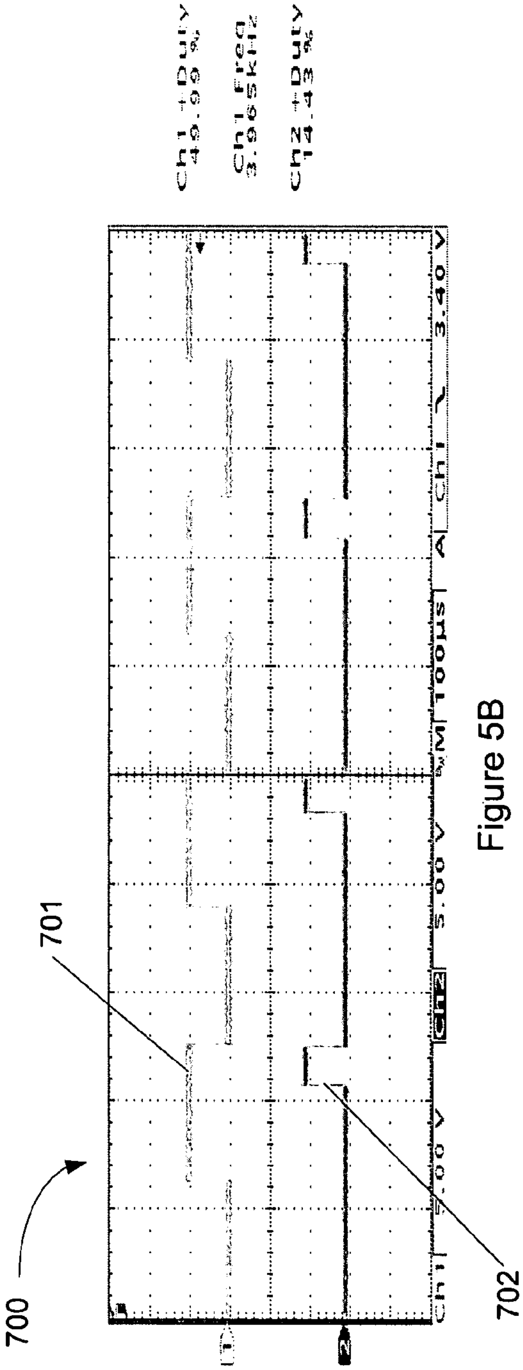
FIG. 5B illustrates two waveforms corresponding to two different duty cycles in conventional PWM modulation

FIG. 5A is an oscillograph 600 illustrating the current through LED 103 in one embodiment, with $f_{clock}$ equal to 1 MHz and n=8, for two different values of signal density. The upper waveform 601 illustrates the LED current for a signal density of approximately 50% and the lower waveform 602 illustrates the LED current for a signal density of approximately 14%. The frequency of the 50% signal density waveform 601 is approximately 500 KHz and the frequency of the 14% signal density waveform 602 is approximately 143 KHz. These waveforms may be compared with the waveforms in oscillograph 700 of FIG. 5B for a prior art PWM modulator. The upper waveform 701 illustrates the LED current for a signal density of approximately 50% and the lower waveform 702 illustrates the LED current for a signal density of approximately 14%. However, the frequency of both waveforms is only 4 KHz.

Figure 1:
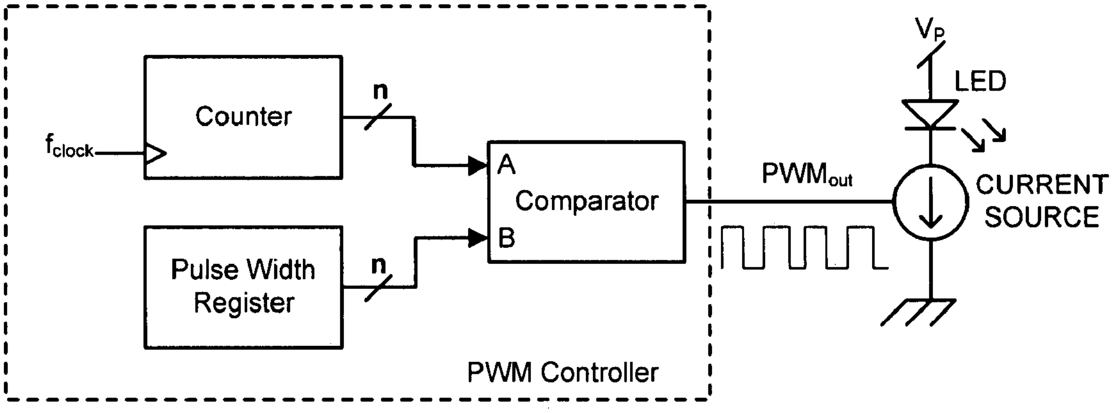
FIG. 1 illustrates a conventional PWM LED control circuit.
Figure 2A:
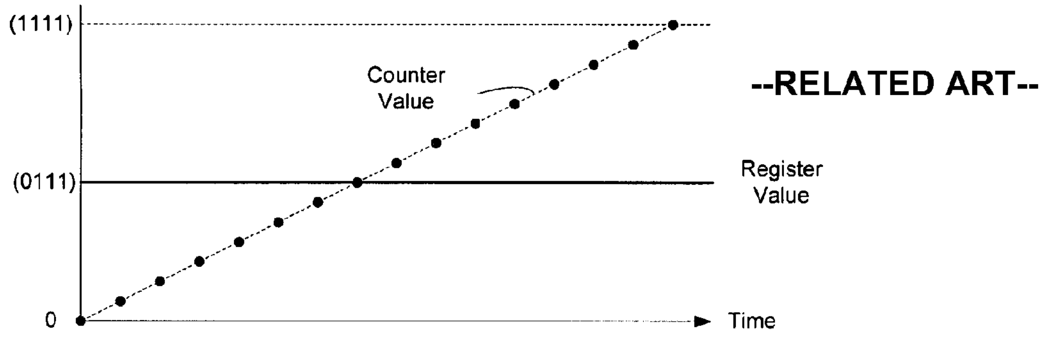
FIGS. 2A and 2B illustrate the generation of a conventional PWM waveform.
Figure 2B:
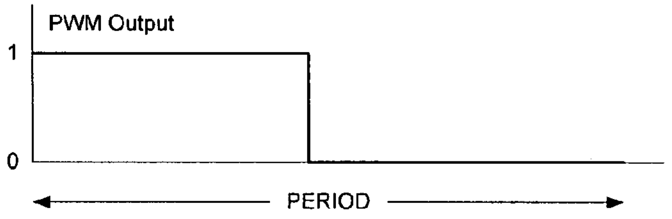
Figure 2C:
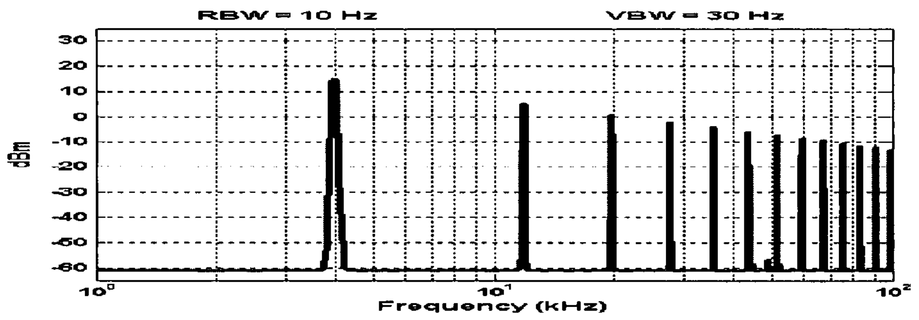
FIG. 2C illustrates the spectrum of a conventional PWM waveform.
Figure 5C:
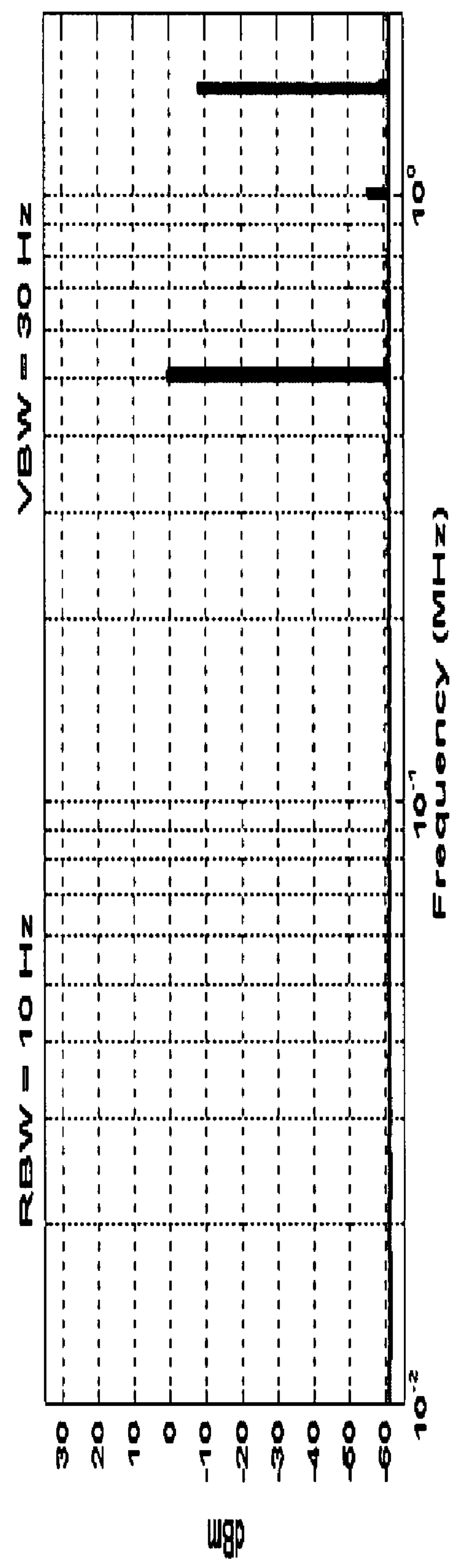
FIG. 5C illustrates a spectral signature of one embodiment of delta-sigma signal density modulation.

FIG. 5C illustrates a modulation spectrum 800 corresponding to the 50% signal density waveform of FIG. 5A. It can be seen that the highest level harmonic (the 3rd harmonic at 1.5 MHz) in spectrum 800 is approximately 10 dB below the fundamental frequency at 500 KHz. This spectral content may be compared to the prior art PWM spectrum of FIG. 2C, where the 3rd harmonic is only 5 dB below the fundamental.

DSSD modulator 101 may be embodied in a variety of ways. In one embodiment, DSSD modulator 101 may be implemented as a processing device having memory to hold data and instructions for the processing device to generate delta-sigma modulation sequences.

In FIG. 3, the anode of LED 103 is coupled to a positive voltage supply $V_{DD}$ and the cathode of LED 103 is coupled to current source 102, which is in turn coupled to ground, such that current source 102 sinks current from LED 103. In other embodiments, the relative positions of current source 102 and LED 103 may be reversed such that the cathode of LED 103 is coupled to ground and the current source 102 is coupled to the positive voltage supply, so that current source 102 sources current to LED 103. In yet other embodiments, the positive voltage supply may be replaced with a ground connection and the ground connection may be replaced with a negative voltage supply.

Figure 6:
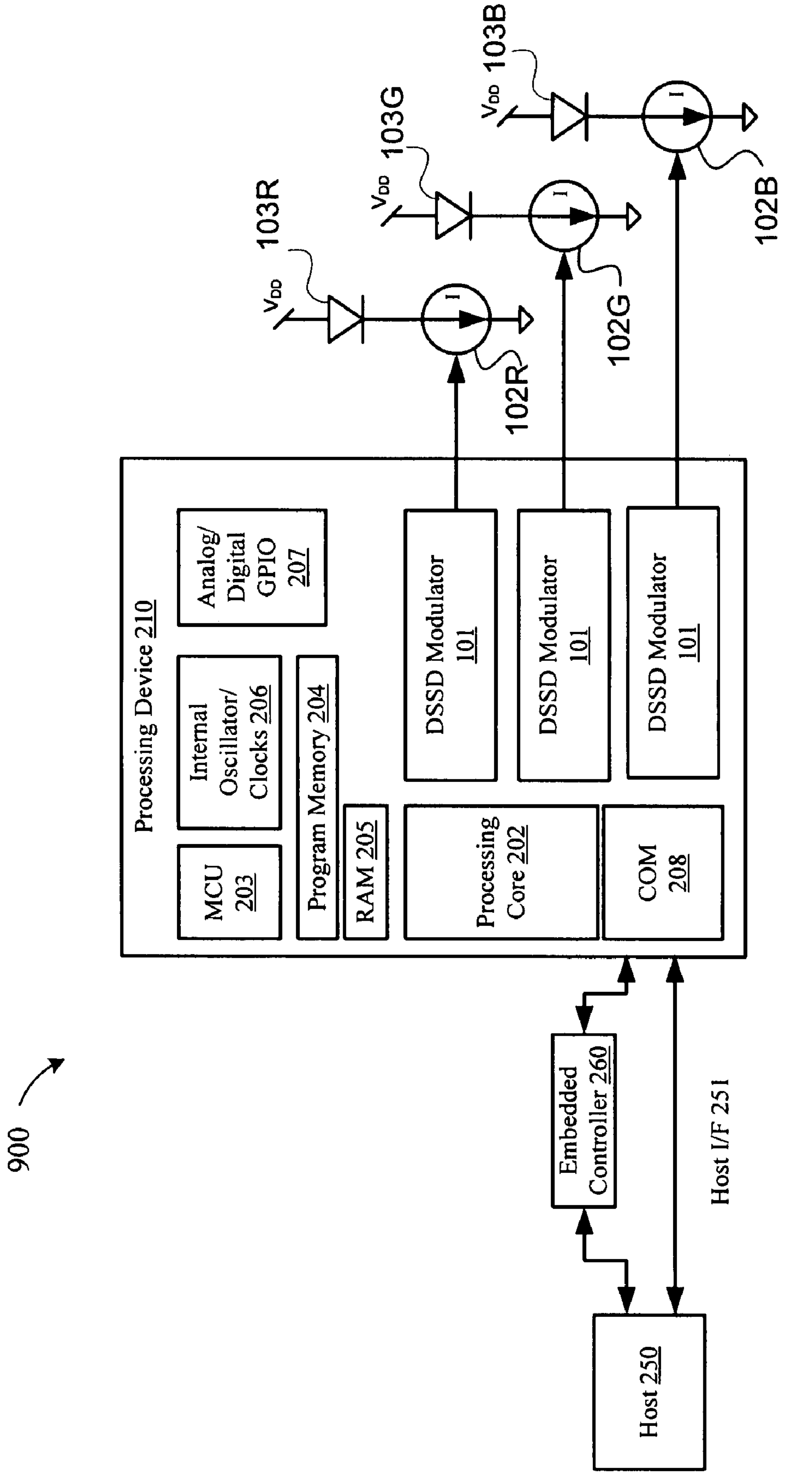
FIG. 6 illustrates an electronic system for delta-sigma signal density modulation of optical transducers in one embodiment.

FIG. 6 illustrates a block diagram of one embodiment of an electronic system 900 in which embodiments of the present invention may be implemented. Electronic system 900 includes a processing device 210 and may include one or more arrays of LEDs. In one embodiment, electronic system 900 includes an array of RGB LEDs including red LED 103R, green LED 103G and blue LED 103B and their corresponding controllable current sources 102R, 102G and 102B. Electronic system 900 may also include a host processor 250 and an embedded controller 260. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not illustrated). The digital block array may be configured to implement a variety of digital logic circuits (e.g., DAC, UARTs, timers, etc.) using, in one embodiment, configurable user modules ("UMs"). The digital block array may be coupled to a system bus (not illustrated). Processing device 210 may also include memory, such as random access memory (RAM) 205 and program memory 204. RAM 205 may be static RAM (SRAM), dynamic RAM (DRAM) or any other type of random access memory. Program memory 204 may be any type of non-volatile storage, such as flash memory for example, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array may also be coupled to the system bus. The analog block array also may be configured to implement a variety of analog circuits (e.g., ADC, analog filters, etc.) using, in one embodiment, configurable UMs. The analog block array may also be coupled to the GPIO 207.

As illustrated in FIG. 6, processing device 210 may be configured to control color mixing. Processing device 210 may include multiple DSSD modulators 101 as described above, which are connected to controllable current sources 102R, 102G and 102B for the control of LEDs 103R, 103G and 103B, which may be red, green and blue LEDs, respectively. Alternatively, LEDs 103R, 103G and 103B may be combinations of other primary, secondary and/or complementary colors.

Processing device 210 may include internal oscillator/clocks 206 and communication block 208. The oscillator/clocks block 206 provides clock signals to one or more of the components of processing device 210. Communication block 208 may be used to communicate with an external component, such as host processor 250, via host interface (I/F) line 251. Alternatively, processing device 210 may also be coupled to embedded controller 260 to communicate with the external components, such as host 250. Interfacing to the host 250 can be achieved through various methods. In one exemplary embodiment, interfacing with the host 250 may be done using a standard PS/2 interface to connect to an embedded controller 260, which in turn sends data to the host 250 via low pin count (LPC) interface. In another exemplary embodiment, interfacing may be done using a universal serial bus (USB) interface directly coupled to the host 250 via host interface line 251. Alternatively, the processing device 210 may communicate to external components, such as the host 250 using industry standard interfaces, such as USB, PS/2, inter-integrated circuit (I2C) bus, or system packet interfaces (SPI). The host 250 and/or embedded controller 260 may be coupled to the processing device 210 with a ribbon or flex cable from an assembly, which houses the sensing device and processing device.

In other words, the processing device 210 may operate to communicate data (e.g., commands or signals to control the absolute and/or relative intensities of LEDs 103R, 103G and 103B)) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may directly communicate with the processing device 210 via host interface 251.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 may be a Programmable System on a Chip (PSoC™) processing device, manufactured by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

DSSD modulator 101 may be integrated into the IC of the processing device 210, or alternatively, in a separate IC. Alternatively, descriptions of DSSD modulator 101 may be generated and compiled for incorporation into other integrated circuits. For example, behavioral level code describing DSSD modulator 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist and the circuit layout all represent various levels of abstraction to describe DSSD modulator 101.

It should be noted that the components of electronic system 900 may include all the components described above. Alternatively, electronic system 900 may include only some of the components described above.

While embodiments of the invention have been described in terms of operations with or on binary numbers, such description is only for ease of discussion. It will be appreciated that embodiments of the invention may be implemented using other types of numerical representations such as decimal, octal, hexadecimal, BCD or other numerical representation as is known in the art.

Embodiments of the present invention, described herein, include various operations. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:

a controllable current source coupled to a light-emitting diode; and a modulator comprising a machine-readable medium containing data that, when read by a machine, causes the machine to perform operations comprising generating a delta-sigma signal density modulation waveform and coupled to the controllable current source, wherein the modulator is configured to provide a delta-sigma modulation control signal to the controllable current source, the delta-sigma modulation control signal having a selected delta-sigma signal density to control an average luminous flux of the light-emitting diode.

2. The apparatus of claim 1, wherein the modulator comprises:

an n-bit adder comprising a first input, a second input, a first output and a second output, wherein the second output comprises the delta-sigma modulation control signal;

an n-bit accumulator comprising:

an input, coupled to the first output of the n-bit adder, to receive a first output value of the n-bit adder; and an output coupled to the first input of the n-bit adder to provide a first input value to the n-bit adder; and an n-bit signal density register, coupled to the second input of the n-bit adder, to provide a signal density value, wherein the first output value of the n-bit adder comprises a remainder of a sum of the first input value and the second input value divided by $2^n$, and wherein the second output value of the n-bit adder comprises an integer value of the sum of the first input value and the second input value divided by $2^n$.

3. The apparatus of claim 2, wherein the signal density register comprises a programmable register.

4. The apparatus of claim 2, wherein the controllable current source is configured to provide a first current level when the second output of the n-bit adder is a first value and to provide a second current level when the second output of the n-bit adder is a second value.

5. The apparatus of claim 4, wherein the first current level comprises a non-zero current level and the second current level is approximately zero.

6. The apparatus of claim 5, wherein the second current level comprises a non-zero current level and the first current level is approximately zero.

7. The apparatus of claim 1, wherein the light-emitting diode comprises an anode and a cathode, wherein a first terminal of the controllable current source is coupled to the anode, and wherein the controllable current source is configured to source current to the light-emitting diode.

8. The apparatus of claim 7, wherein the cathode of the light-emitting diode is coupled to a first voltage, wherein a second terminal of the controllable current source is coupled to a second voltage, and wherein the second voltage is positive with respect to the first voltage.

9. The apparatus of claim 1, wherein the light-emitting diode comprises an anode and a cathode, wherein a first terminal of the controllable current source is coupled to the cathode, and wherein the controllable current source is configured to sink current from the light-emitting diode.

10. The apparatus of claim 9, wherein the anode of the light-emitting diode is coupled to a first voltage, wherein a second terminal of the controllable current source is coupled to a second voltage, and wherein the first voltage is positive with respect to the second voltage.

11. A method, comprising:

providing a controllable current for a light emitting diode;

generating the delta-sigma modulation control signal, controlling the current with a delta-sigma modulation control signal to control a luminous flux output of the light emitting diode; and modulating the controllable current with the delta-sigma modulation control signal wherein generating the delta-sigma signal density control signal comprises:

providing an n-bit modulation value A and an n-bit accumulator value B, replacing the n-bit accumulator value B with a value modulo $[(A+B)/2^n]$, and providing an output signal having a value equal to integer $[(A+B)/2^n]$.

12. The method of claim 11, further comprising:

providing a first current level to the light-emitting diode when the output signal has a first value; and providing a second current level to the light-emitting diode when the output signal has a second value.

13. The method of claim 12, wherein the first current level comprises a non-zero current level and the second current level is approximately zero.

14. The method of claim 12, wherein the second current level comprises a non-zero current level and the first current level is approximately zero.

* * * * *